United States Patent
Chen et al.

(10) Patent No.: US 10,019,313 B2
(45) Date of Patent: Jul. 10, 2018

(54) FLASH CHANNEL WITH SELECTIVE DECODER LIKELIHOOD DAMPENING

(71) Applicant: Seagate Technology LLC, Cupertino, CA (US)

(72) Inventors: Zhengang Chen, San Jose, CA (US); Yunxiang Wu, Cupertino, CA (US); AbdelHakim S Alhussien, Milpitas, CA (US); Erich F Haratsch, Bethlehem, PA (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 65 days.

(21) Appl. No.: 14/928,941

(22) Filed: Oct. 30, 2015

(65) Prior Publication Data

US 2016/0246674 A1    Aug. 25, 2016

Related U.S. Application Data

(63) Continuation of application No. 14/093,110, filed on Nov. 29, 2013, now Pat. No. 9,176,815.
(Continued)

(51) Int. Cl.
*H03M 13/03* (2006.01)
*G06F 11/10* (2006.01)
(Continued)

(52) U.S. Cl.
CPC ...... *G06F 11/1068* (2013.01); *G11C 11/5642* (2013.01); *G11C 16/26* (2013.01); *G11C 29/021* (2013.01); *G11C 29/028* (2013.01); *G11C 29/52* (2013.01); *H03M 13/1105* (2013.01); *G11C 7/14* (2013.01); *G11C 2029/0411* (2013.01)

(58) Field of Classification Search
CPC .. G06F 11/1068; G06F 11/1048; G06F 12/00; G06F 11/1044; G06F 11/141; G06F 11/1076; H03M 13/1102; H03M 13/1111; H03M 13/152; H03M 13/1545; H03M 13/6362; H03M 13/2906; G11C 11/5621; G11C 11/5692; G11C 29/00; G11C 2029/0411
See application file for complete search history.

(56) References Cited

U.S. PATENT DOCUMENTS 8,219,878 B1 * 7/2012 Varnica .............. H03M 13/1111
714/758
8,769,380 B1 * 7/2014 Burd .................. H03M 13/1128
714/774

(Continued)

*Primary Examiner* — Guerrier Merant
(74) *Attorney, Agent, or Firm* — Cesari & Reed, LLP; Kirk A. Cesari; Logan Brown

(57) ABSTRACT

An apparatus for reading a flash memory includes a read controller operable to read the flash memory to yield read patterns, a likelihood generator operable to map the read patterns to likelihood values, a decoder operable to decode the likelihood values, a data state storage operable to retrieve the likelihood values for which decoding failed, and a selective dampening controller operable to select at least one dampening candidate from among the likelihood values for which decoding failed, to dampen the likelihood values of the at least one dampening candidate to yield dampened likelihood values, and to provide the dampened likelihood values to the decoder for decoding.

18 Claims, 2 Drawing Sheets

Related U.S. Application Data

(60) Provisional application No. 61/910,100, filed on Nov. 28, 2013.

(51) Int. Cl.
*G11C 11/56* (2006.01)
*G11C 16/26* (2006.01)
*G11C 29/02* (2006.01)
*G11C 29/52* (2006.01)
*H03M 13/11* (2006.01)
*G11C 7/14* (2006.01)
*G11C 29/04* (2006.01)

(56) References Cited

U.S. PATENT DOCUMENTS

| | | | | |
|---|---|---|---|---|
| 8,856,615 B1* | 10/2014 | Krishnan | .......... | H03M 13/2957 714/718 |
| 8,984,376 B1* | 3/2015 | Norrie | .................. | H03M 13/114 714/772 |
| 9,176,815 B2* | 11/2015 | Chen | ................... | G06F 11/1068 |
| 2005/0120286 A1* | 6/2005 | Akamatsu | ............. | H03M 13/63 714/792 |
| 2006/0192691 A1* | 8/2006 | Kan | .................. | H03M 13/1191 341/50 |
| 2010/0088575 A1* | 4/2010 | Sharon | ............... | G06F 11/1072 714/763 |
| 2011/0083060 A1* | 4/2011 | Sakurada | ........... | G11C 11/5642 714/763 |
| 2012/0213001 A1* | 8/2012 | Yang | .................. | G06F 11/1048 365/185.2 |
| 2013/0163328 A1* | 6/2013 | Karakulak | ............ | G11C 16/10 365/185.2 |
| 2014/0143637 A1* | 5/2014 | Cohen | ................. | H03M 13/1108 714/773 |
| 2015/0095736 A1* | 4/2015 | Leem | .................... | G06F 11/141 714/758 |

* cited by examiner

FLASH CHANNEL WITH SELECTIVE DECODER LIKELIHOOD DAMPENING

CROSS REFERENCE TO RELATED APPLICATIONS

The present application is a continuation of and claims priority to U.S. patent application Ser. No. 14/093,110, filed Nov. 29, 2013 and entitled "Flash Channel With Selective Decoder Likelihood Dampening", which claimed priority to U.S. Provisional Patent Application Ser. No. 61/910,100, filed Nov. 28, 2013 and entitled "Flash Channel With Selective Decoder Likelihood Dampening", the entirety of which are incorporated herein by reference for all purposes.

FIELD OF THE INVENTION

Various embodiments of the present invention provide systems and methods for dampening likelihood values in a data channel for a decoder.

BACKGROUND

Non-volatile memories such as flash memory can be used to store data in a wide range of different applications, such as a solid state disk (SSD). Data is read from the non-volatile memory in blocks referred to herein as a "read unit" or as a "codeword" that is protected from error by included error correction, such as included parity bits generated using an error correction algorithm such as low density parity check (LDPC) encoding. In some cases, each read unit contains approximately 4K to approximately 32K bits of user data, plus error correction bits. Under command of a solid state disk controller, those bits are read from non-volatile memory cells, e.g., via an array access. The resulting data is decoded to apply the error correction algorithm, for example in a low density parity check decoder. If the data fails to converge in the low density parity check decoder, a retry operation can be used to re-read the data and to again apply the error correction algorithm. Although cell voltage is continuous, non-volatile volatile memory cells generally provide only binary hard decisions after a read operation. When soil iterative decoding algorithms such as low density parity check decoding, are used for error correction, it is desirable to convert the hard decisions generated by the non-volatile memory into soft decisions that give the decoder more information to help correct errors.

BRIEF SUMMARY

Some embodiments of the present invention provide an apparatus for reading a flash memory, including a read controller operable to read the flash memory to yield read patterns, a likelihood generator operable to map the read patterns to likelihood values, a decoder operable to decode the likelihood values, a data state storage device or memory operable to retrieve the likelihood values for which decoding failed, and a selective dampening controller operable to select at least one dampening candidate from among the likelihood values for which decoding failed, to dampen the likelihood values of the at least one dampening candidate, and to provide the dampened likelihood values to the decoder for decoding.

This summary provides only a general outline of some embodiments according to the present invention. Many other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components.

DETAILED DESCRIPTION OF THE INVENTION

Figure 1:
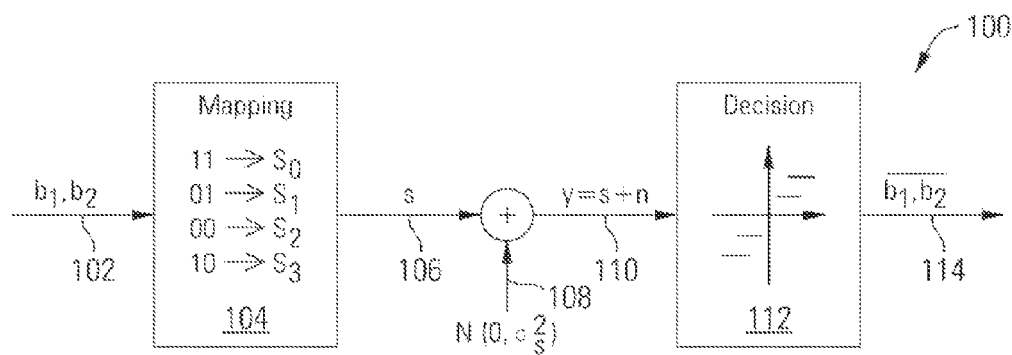
FIG. 1 depicts a model of a flash channel in which decoder likelihood dampening can be selectively applied in accordance with some embodiments of the present invention.

Embodiments of the present invention are related to syndrome weight-based selective dampening of decoder soft input in a flash channel. Data representing a page or codeword is read from a flash memory in any suitable manner. In some embodiments, particularly during a retry read, a multiple stage read can be performed using a number of read reference voltages, yielding a multi-bit data pattern. The data is mapped to soft decisions, which are provided as an input to a decoder. The soft decisions can be in any suitable format, such as, but not limited to, log likelihood ratios or plain likelihood values. Although the embodiments disclosed herein are adapted for use with log likelihood ratios, for uniformity, the flash channel with selective decoder likelihood dampening can equivalently use any form of soft decision representing beliefs about values of data.

The decoder can be any type of decoder for detecting and correcting errors in data, such as, but not limited to, a low density parity check decoder. A tow density parity cheek code is a parity-based code with which parity bits are added to user data before writing it to the flash memory. In the low density parity check decoder, multiple parity checks are performed in a number of check nodes for the data in variable nodes connected to the check nodes. Messages are passed between connected check nodes and variable nodes in an iterative process, passing belief's about the values that should appear in the variable nodes. Parity checks are performed in the check nodes based on the messages and the results are returned to connected variable nodes to update the beliefs if necessary. Thus, errors can be identified and corrected in most cases. Any low density parity check algorithm can be applied, such as, but not limited to, a min-sum low density parity check algorithm. Based upon the disclosure provided herein, one of ordinary skill in the art will recognize a variety of data decoders that can be used in relation to different embodiments of the present invention.

A syndrome or result vector is calculated in the decoder, identifying variable nodes with unsatisfied parity checks. If the syndrome is a zero-valued vector, the codeword is correct and is provided as a hard decision output from the decoder. If the syndrome contains non-zero vector elements, the data failed to converge and decoding was unsuccessful. The syndrome weight, or number of unsatisfied checks identified in the syndrome, is a representation of the number of errors in the data.

When decoding fails to converge, a variety of retry operations can be initiated in an attempt to correctly re-read and/or re-decode the data to correct errors. For example, in some embodiments, a retry operation includes changing the read reference voltages used to read the flash memory, and the data is re-read from the same locations in the flash memory. The data is again mapped to soft decisions and decoded. In some embodiments, a retry operation includes applying log likelihood compensation and re-decoding, for example by adding log likelihood ratios from multiple global iterations together (where a global iteration includes processing of log likelihood ratios outside of the decoder, in contrast to local iterations which are processed inside the decoder). In some embodiments, a retry operation includes other retry algorithms that manipulate the log likelihood ratios before decoding or re-decoding, such as, but not limited to, targeted bit or symbol flipping, bit selective scaling (BSS), extrinsic log likelihood ratio adjusting or parity forcing, etc.

One class of retry operations, decoder likelihood dampening or damping, lowers the likelihood magnitudes for some or all of the codeword data before re-decoding. For example, by dampening the log likelihood ratios before re-decoding, the confidence in the data values expressed by the log likelihood ratios is reduced, making it easier for the decoder to change those data values during decoding. This makes it less likely that an incorrect value will be stuck and unchangeable in the decoder because of a high initial confidence value. Likelihood dampening is particularly effective when operating in the error floor condition, where the slope in a plot of bit error rate (BER) versus signal, to noise ratio (SNR) decreases and tends to flatten or partially flatten. Error-floor often causes a decoding operation to fail with a low syndrome weight, for example due to relatively small trapping sets that trap incorrect values in the decoder and prevent correction. Error floor typically has a much lower probability of occurrence than other noise induced, errors such as retention, and dampening therefore is often performed at or near the end of the retry flow, after performing other retry operations directed at more common error conditions.

The flash channel with selective decoder likelihood dampening is not limited to any particular dampening algorithm. Based upon the disclosure provided herein, one of ordinary skill in the art will recognize a variety of dampening algorithms that can be used in relation to different embodiments of the present invention. The dampening can be performed with or without shortening, wherein saturated log likelihood ratio magnitudes are maintained for bits whose values are known a priori while other log likelihood ratios are dampened.

The flash channel with selective decoder likelihood dampening stores the data state and syndrome weights for multiple retries which resulted in decoding failure, and selects one or more corresponding decoder inputs on which to apply dampening and re-decoding. Without the selection process disclosed herein, all previously failed decoder inputs could be dampened and re-decoded, with the penalty of substantially increasing the maximum latency in the retry process, or dampening could be performed only on the last decoder inputs that failed, at the risk of missing the decoder inputs that would most benefit from dampening and re-decoding. By selecting decoder inputs for dampening and re-decoding, the maximum latency is reduced and dampening is applied where most likely to result in decoding success.

The decoder inputs that are selected, for dampening comprise a set of likelihood values for a codeword, such as log likelihood ratios, and can be stored after each failing retry either as log likelihood ratios or as a mapping between the data and the log likelihood ratios. For example, the data state is saved in some embodiments by storing the log likelihood ratio lookup tables used to generate each log likelihood ratio set that failed decoding. Given the original set of data that was converted to log likelihood ratios, and the various lookup tables that were used to convert the original set of data to log likelihood ratios, each failed set of log likelihood ratios can be recreated for dampening and re-decoding without having to fully store each foiled set of log likelihood ratios. Thus, memory requirements are reduced by saving the data state as the lookup tables used to generate the log likelihood, ratios. However, the flash channel with decoder likelihood dampening is not limited to any particular method of storing the data states which resulted in decoding failure.

The selection of log likelihood ratios can be based on one or more criteria. In some embodiments, a data set is selected when its syndrome weight is lower than a threshold T. The value of threshold T can be dependent on the low density parity check code. The value of threshold T can be any suitable value that identifies log likelihood ratios that would benefit from dampening. As an example, if in one retry operation the log likelihood ratio lookup table is [−6, −3, −2, −1, 1, 2, 4, 6] and the resulting syndrome weight is 79, and if in another retry operation the log likelihood ratio lookup table is [−7, −5, −3, 0, 1, 2, 3, 5] and the resulting syndrome weight is 8, and if the threshold were 10, the latter retry operation has a syndrome weight, lower than the threshold, the latter retry operation is thus more likely to benefit from dampening, which is particularly beneficial, in error floor failures with low syndrome weights. The log likelihood, ratios for the latter case are therefore selected for dampening and re-decoding. The data states and syndrome weights for both (and others) will have been, stored, in some embodiments by storing the log likelihood ratio lookup table [−7, −5, −3, 0, 1, 2, 5]. A new set of dampened log likelihood ratios is generated in any suitable manner, for example by modifying the log likelihood ratio lookup table to dampen, the resulting log likelihood ratios, and mapping the original data set read from the flash memory with the modified lookup table to generate the dampened log likelihood ratios. The dampened log likelihood ratios are then re-decoded.

In some other embodiments, the criterion used to select log likelihood ratios for dampening comprises sorting or ranking the tailed log likelihood ratio sets by their syndrome weights, and selecting a given number of them with the lowest syndrome weights for dampening and re-decoding. In these embodiments, the number of failed log likelihood ratio sets to dampen and re-decode can be based on a budget for the number of retries that can be performed. For example, if the latency imposed by a particular number of retries is acceptable, that number of failed log likelihood ratio sets can be selected for dampening and re-decoding. In some embodiments, the criterion is a combination of the two disclosed above, selecting up to a predetermined number of failed log likelihood ratio sets with the lowest syndrome weights that are also below the threshold.

Although the selective application of likelihood dampening and re-decoding disclosed herein is not limited to any particular source of data, in some embodiments, data is read from a non-volatile memory or flash memory as the reference voltages used to read the memory are adjusted and as lookup tables that map between read data read and log likelihood ratios are generated. In these embodiments, multiple retry reads of a memory page are performed at different read reference voltages to obtain a quantized, version of the stored voltage on the cell. Afterwards, the multiple read pattern for each bit is then mapped to a log-likelihood ratio (LLR) that represents the confidence level of the bit value being 0 or 1. Finally, the log-likelihood ratios are passed, as the soil data input to the low density parity check decoder to recover the written data.

Considered individually, each non-volatile memory cell has a particular stored (programmed) charge that corresponds to a device threshold voltage for that cell, and further corresponds to the logical bit values being stored in the cell. While ideally all of the cells in the non-volatile memory would have identical device threshold voltages for the logical bit values stored, in practice for a variety of reasons the device threshold voltages differ across the cells in probability distributions that are similar to a Gaussian distribution. Thus considered, in aggregate across a large number of cells, such as of a read unit, there are as many device threshold voltage distributions (e.g., Gaussian probability curves) as there are states per cell (two states per bit of storage per cell). That is, for N-bits per cell of storage, there are $2^N$ states and the same number of device threshold voltage distributions. Thus, $2^N-1$ different read reference voltages may be needed by read, circuits in the non-volatile memory to distinguish between the $2^N$ states.

The device threshold voltage distributions vary from their initial/nominal distributions by one or more factors, such as read disturb, write disturb, and retention loss. More particularly, over time, temperature, and other factors related to use, the location of each of the device threshold voltage-distributions can change with respect to the device threshold voltage axis. Each changes increase the likelihood of read errors that am performed using a read, reference-voltage value for the read threshold that was previously established based on the nominal device threshold, voltage distribution. In some embodiments, when a hard-decision uncorrectable error is encountered in a read unit read from non-volatile memory, a series of retry operations is performed to recover the read unit. The retry operations include the controller re-reading the read unit with different reference voltages as adjusted based on channel tracking.

The retry read reference voltage adjustment disclosed herein can be applied to both single-level cell (SLC) flash memories, where N=1, and to multi-level cell (MLC) flash memories, where N>1. Single-level cell memories store one bit per cell of storage, have two device threshold voltage distributions (one for zeroes and another for ones), and use a single read threshold, read reference voltage $V_{REF0}$. From lower to higher device threshold voltages, the two device threshold voltage distributions are known as the E (Erased) state and D1 (first Data) state. While arbitrary, a mapping or coding in some embodiments assigns logical one to the E state and logical zero to the D1 state. Thus references to zeroes and ones are proxy references for respective decodings of the D1 state and the E state. Multi-level cell memories store more than one bit per cell, have more than two device threshold voltage distributions, and use multiple different read thresholds to distinguish the distributions. For example, a four level cell memory stores two bits per cell, has lour device threshold voltage distributions, and generally uses three read thresholds (read voltage references $V_{REF1}$, $V_{REF2}$, and $V_{REF3}$). From lower to higher device threshold voltages, the four device threshold voltage distributions are known as the E (Erased), D1 (Data1), D2 (Data2), and D3 (Data3) states. While arbitrary, each of the four device threshold voltage distributions is also mapped (addressed) in accordance with a particular binary sequence, such as a Gray code sequence. Thus references to one or more of the 11, 10, 00, and 01 states, are proxy references for respective decodings of the E, D1, D2, and D3 states.

For a single-level memory cell, a tracking module estimates the means and variances of the voltage distributions of states D1 and E, and sets the read reference voltage $V_{REF0}$ based on these distributions. The calculated $V_{REF0}$ will lie at the intersection of the distributions when 0's (state E) and 1's (state D1) are equally likely in the written data. A read control module initiates M data reads of the addressed page from the flash device to the read buffer, with the first read at a read reference voltage of $V_{REF0}$ and the subsequent read reference voltages at different levels around $V_{REF0}$ as determined by channel tracking of the means and variances of the voltage distributions of states D1 and E. For a multi-level memory cell, the tracking module estimates the means and variances of the voltage distributions of all states.

Turning to FIG. 1, a model of a flash channel 100 is depicted in which decoder likelihood dampening can be selectively applied in accordance with some embodiments of the present invention. Notably, two-bit inputs with four states are used in this example, although the selective likelihood dampening disclosed herein is not limited to use with any particular bit width or number of states. For two input data bits 102, the two data, bits 102 $b_1 b_2$ can be mapped to four possible states in a mapping 104. For example, value '11' for the two data bits 102 can be mapped to state $s_0$, value '01' to state $s_1$, value '00' to state $s_2$, and value '10' to state $s_3$. For a multi-level cell, the cell is programmed to a selected state 106 from the four states depending on the value of the two data bits 102. As voltages representing the selected state 106 are written to and read from the memory cell, noise 108 is added due to the programming process and other inefficiencies and disturbances, yielding a noisy cell voltage 110y. The noise can be considered to be an additive white Gaussian, noise (AWGN), with the noise variances being different depending on the signal transmitted.

The hard decisions (e.g., 110) of read operations can be converted into soft decisions (e.g., 114) (log likelihood ratio values) based on the knowledge of the channel in a decision, process (e.g., 112). Hard decision states can be divided into a number of soft decision states, and read data from those soft decision states is mapped to log likelihood ratios based on the likelihoods for each soft decision state that a bit in those states is correct.

Figure 2:
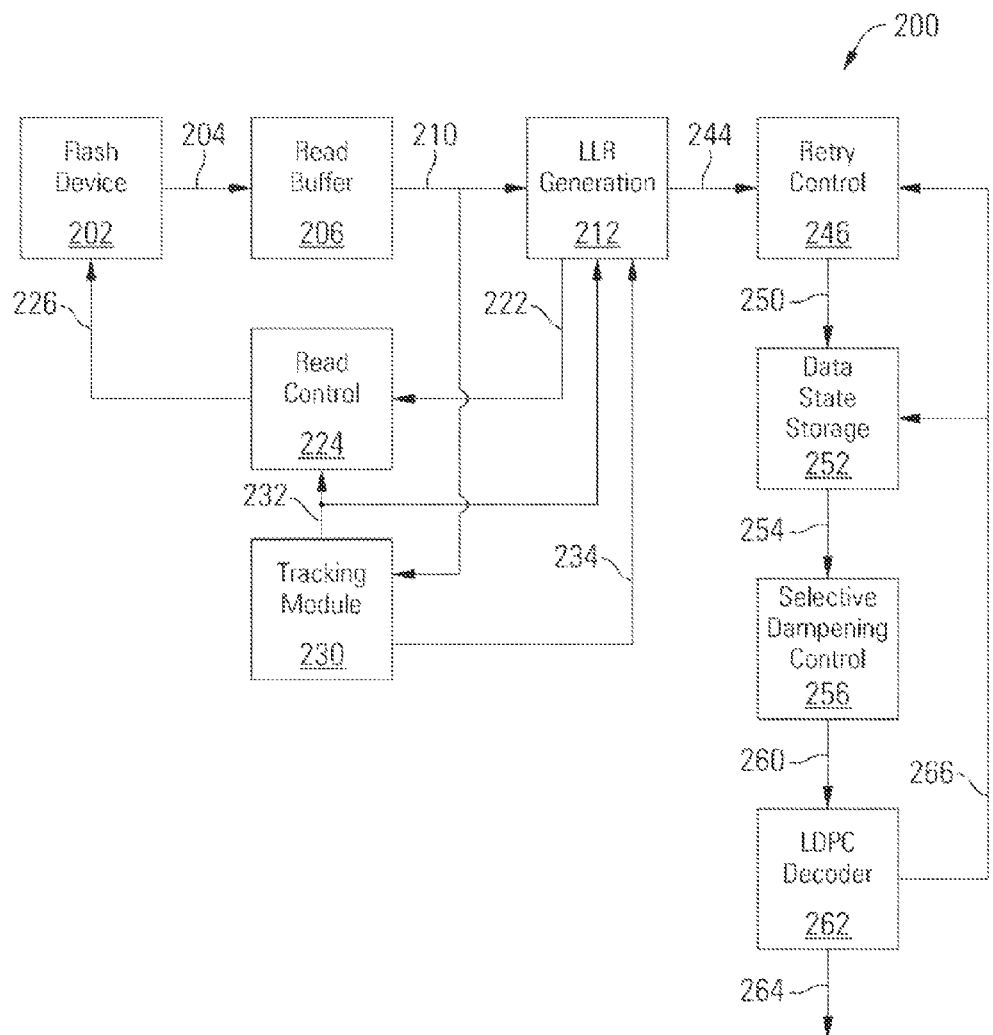
FIG. 2 depicts a flash channel read path with selective decoder likelihood dampening in accordance with some embodiments of the present invention.

Turning to FIG. 2, a flash channel 200 with selective decoder likelihood dampening is depicted in accordance with some embodiments of the present invention. The flash channel 200 includes a flash device 202 having an array of memory cells, or any other type of non-volatile memory. Based upon the disclosure provided herein, one of ordinary skill in the art will recognize a variety of storage technologies that can benefit from the selective decoder likelihood dampening disclosed herein.

Read reference voltages 226 are applied to the flash device 202 by a read control device 224 in a series of N reads. Each memory cell is read N times, and the N reads result in read data 204 containing N bits per memory cell as a quantized version of the stored voltage on the memory cell. The read data 204 is buffered in a read buffer 206, and buffered read data 210 from read buffer 206 is provided to a log likelihood ratio generation circuit 212 (or likelihood generator, which can also be adapted to use plain likelihood values). The N bits for a memory cell are mapped to log likelihood ratios for the memory cell in log likelihood ratio generation circuit 212. In some embodiments, the log likelihood ratio generation circuit 212 contains a lookup table that maps the read patterns in buffered mad data 210 to log likelihood ratios.

A tracking module 230 receives the buffered read data 210 from the read buffer 206, or from any other suitable source. The tracking module 230 identifies the intersection point between neighboring voltage distributions for a memory cell, and provides read reference voltage levels 232, including the read reference voltage $V_{REF0}$ corresponding to the intersection. When, the read reference voltage $V_{REF0}$ corresponding to the intersection is used for the soft read operation, it will result in a reduction in the bit error rate. The read reference voltage $V_{REF0}$ is used in some embodiments as the first read reference voltage of a retry read operation, and additional read reference voltages around $V_{REF0}$ to obtain all possible log likelihood ratio values. The tracking module 230 thus generates the read reference voltage levels 232 to be used in retry read operations.

The tracking module 230 also tracks the voltage distributions calculating the means and the variances $\sigma_0$, $\sigma_1$ for at least some voltage distributions. Given the assumption that the voltage distributions have a Gaussian, distribution, the voltage distribution means and variances 234 identify the intersection points between neighboring distributions. In some embodiments, the tracking module 230 calculates the voltage distribution means and variances 234 for each voltage distribution corresponding to each possible state in each memory cell. In some other embodiments, the tracking module 230 calculates the voltage distribution means and variances 234 for each voltage distribution corresponding to each possible state in groups of memory cells. The voltage distribution means and variances 234 can be calculated in any suitable manner based on the read data. As an example, the tracking module 230 can operate as disclosed in U.S. patent application Ser. No. 13/533,130, filed Jun. 26, 2012 for "FAST TRACKING FOR FLASH CHANNELS", which is incorporated herein by reference for all purposes. Based upon the disclosure provided herein, one of ordinary skill in the art will recognize a variety of techniques for calculating means and variances based on data sampled from Gaussian distributions.

For a two-state memory cell, or single-level memory cell, the tracking module 230 estimates the means and variances of the voltage distributions of states '1' and '0', as well as the read reference voltage $V_{REF0}$ that most reduces the bit error rate and which likely lies at the intersection of those distributions when 0's and 1's are equally likely in the written data.

The tracking module 230 provides the voltage distribution means and variances 234 to the log likelihood ratio generation circuit 212 for use in updating the log likelihood ratio lookup table. The log likelihood ratio generation circuit 212 determines where to place the other N−1 read reference voltages around $V_{REF0}$ 232 based on the voltage distribution means and variances 234 and on the read reference voltage $V_{REF0}$ 232 to obtain all possible log likelihood ratio values when the read patterns in buffered read data 210 are mapped to log likelihood ratios. The log likelihood ratio generation circuit 212 determines where to place the other N−1 read reference voltages around $V_{REF0}$ 232, updates the lookup table, and provides the N−1 read reference voltage levels 222 to a read controller 224.

The channel tracking-based retry read voltage adjustment algorithm is implemented in the log likelihood ratio generation circuit 212 based on the channel tracking information provided by the tracking module 230. The read reference voltages are stored, in log likelihood ratio generation circuit 212 in some embodiments, as calculated based, on the log likelihood ratio lookup table in log likelihood ratio generation circuit 212 and on the voltage distribution means and variances 234 from, tracking module 230.

The read controller 224 controls the retry read operations in the flash, device 202, providing each of the N read reference voltages (including $V_{REF0}$ 232) to be used when reading the memory cells in the flash device 202. The read controller 224 initiates N reads of a page, with the first read using read reference voltage $V_{REF0}$ some embodiments, and with the subsequent N−1 roads at read references voltages around $V_{REF0}$ as determined by log likelihood ratio generation circuit 212. The retry read operations performed by the read controller 224 can be performed a number of times, repeatedly changing reference voltages and re-reading data from the flash device 202. Each set of data, is mapped to log likelihood ratios 244 in log likelihood ratio generation circuit 212 and decoded in low density parity cheek decoder 262. The number of retry read operations can be limited to a maximum number of reads. If the log likelihood ratios 244 converge in decoder 262 before the maximum number of reads is reached, the decoded data 264 is output from decoder 262.

Otherwise, the retry read operations failed and additional recovery operations can be performed on log likelihood ratios 244 by retry controller 246. The retry controller 246 can manipulate the log likelihood ratios 244 in any manner in an attempt to help the decoder 262 converge on the correct values. For example, retry controller 246 can perform targeted bit or symbol flipping, bit selective sealing (BSS), extrinsic log likelihood ratio adjusting or parity forcing, etc., each time generating altered log likelihood ratios 250 in an attempt to help the decoder 262 converge on the correct values. The altered log likelihood ratios 250 are stored in some fashion in data state storage 252. In some embodiments, data state storage 252 stores the lookup tables used to generate log likelihood ratios for each set of log likelihood ratios that fail during decoding. In other embodiments, entire sets of log likelihood ratios can be stored in data state storage 252. The data state storage 252 also stores syndrome weights 266 from decoder 262 for each set of log likelihood ratios that fails during decoding.

If the read retries performed by read controller 224 and the retry operations performed by retry controller 246 fail to result in successful decoding, a selective dampening controller 256 selects log likelihood ratio sets based on their syndrome weights 266. The log likelihood ratios to be dampened by selective dampening controller 256 are generated in any suitable manner, for example by mapping the buffered read data 210 to log likelihood ratios based on the lookup table stored in data state storage 252. The dampening can be performed in any suitable manner, for example by altering the lookup table stored in data state storage 252, or by providing a secondary dampening lookup table to selectively dampen some portions of the codeword, or by multiplying log likelihood ratios by scaling factors as they are generated, etc. The dampening can be applied uniformly across an entire codeword or to selective portions of the codeword, for example to larger bits associated with unsatisfied parity checks.

The dampened log likelihood ratios 260 are then provided to decoder 262 for decoding. Again, multiple sets of dampened log likelihood ratios 260 can be generated and decoded based on the selective criteria. If any of them are successfully decoded by decoder 262, the decoded data 264 is output from decoder 262. If each set of dampened log likelihood ratios 260 is decoded and none converge, the selective decoder likelihood dampening fails and other recovery steps can be taken, if desired.

Figure 3:
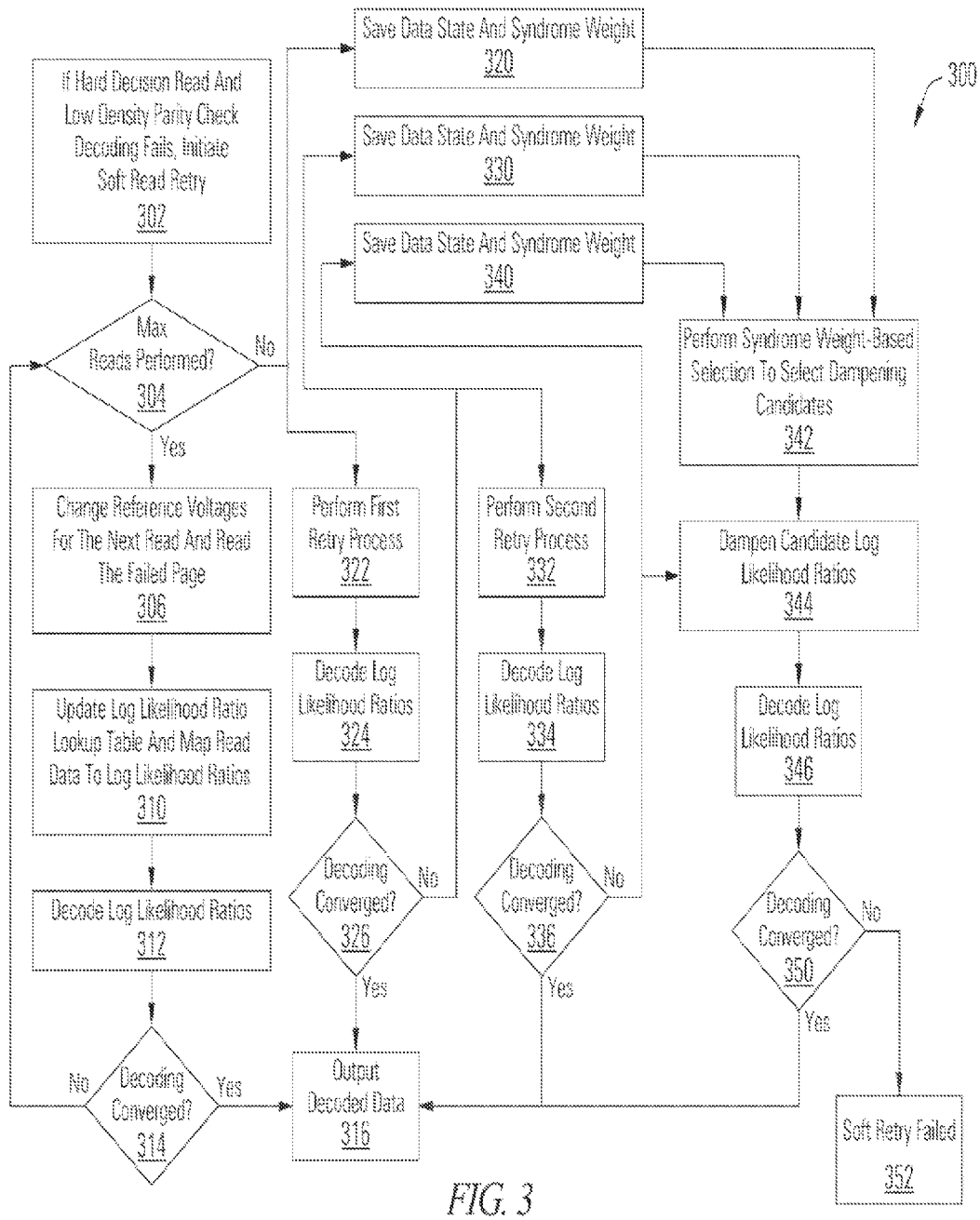
FIG. 3 depicts a diagram of an operation for selectively dampening decoder inputs in a flash channel in accordance with some embodiments of the present invention.

Turning to FIG. 3, a flow diagram 300 depicts an operation for selectively dampening decoder inputs in a flash channel in accordance with some embodiments of the present invention. Following flow diagram 300, if a hard decision read and low density parity check decoding fails, the flash channel enters a soft read retry. (Block 302) A determination is made as to whether the maximum, number of reads has already been made in the soft read retry process. (Block 304) If not, the reference voltages are changed for the next read and the failed codeword is read. (Block 306) In some embodiments, the number of reference voltages is increased with each successive retry read. The log likelihood ratio lookup table is updated and the read data is mapped to log likelihood ratios. (Block 310) The fog likelihood ratios are decoded, for example in a min-sum low density parity check decoder. (Block 312) A determination is made as to whether the decoding converged. (Block 314) In some embodiments, this is performed by calculating a syndrome and determining whether the syndrome has a 0 value. If the decoding failed, the soft read retry process continues at block 304. If the decoding successfully converged, the decoded data is output. (Block 316)

If the maximum number of reads has been performed in the soft read retry process (per block 304) without successfully decoding, one or more other retry features can be performed, manipulating the log likelihood ratios for the same read data in an attempt to successfully decode the codeword. The data state and syndrome weight for the failed soft, read retry process is saved. (Block 320). In some embodiments, this is accomplished by saving the log likelihood ratio lookup table used to generate the last log likelihood ratios that failed decoding. A first retry process is performed, generating new log likelihood ratios for the read data. (Block 322) The first retry feature can be any retry algorithm that manipulates the log likelihood ratios before re-decoding, such as, but not limited to, targeted bit or symbol flipping, bit selective scaling (BSS), extrinsic log likelihood ratio adjusting or parity forcing, etc. The resulting fog likelihood ratios are decoded. (Block 324)

A determination is made as to whether the decoding converged. (Block 326) If the decoding successfully converged, the decoded data is output. (Block 316) Otherwise, the data state and syndrome weight for the failed soft read retry process is saved. (Block 330) A second retry process is performed, generating new log likelihood ratios for the read data. (Block 332) The second retry feature can be any retry algorithm that manipulates the log likelihood ratios before re-decoding, such as, but not limited to, targeted bit or symbol flipping, bit selective scaling (BSS), extrinsic log likelihood ratio adjusting or parity forcing, etc. The resulting log likelihood ratios are decoded. (Block 334)

A determination is made as to whether the decoding converged. (Block 336) if the decoding successfully converged, the decoded data is output. (Block 316) Otherwise, the data state and syndrome weight for the failed soft read retry process is saved. (Block 340) The two retry features (blocks 322, 332) shown in flow chart 300 are merely examples, and any number of retry features can be used that manipulate the log likelihood ratios before re-decoding.

A syndrome weight based selection is performed to select dampening candidates from among the saved data states for the fog likelihood ratios sets that failed decoding. (Block 342) in some embodiments, a data set is selected when its syndrome weight is lower than a threshold T. In some other embodiments, the criterion used to select log likelihood ratios for dampening comprises sorting or ranking the failed log likelihood ratio sets by their syndrome weights, and selecting a given number of them with the lowest syndrome weights for dampening and re-decoding. In some embodiments, the criteria is a combination of the two disclosed above, selecting up to a predetermined number of failed log likelihood ratio sets with the lowest syndrome weights and which are below a threshold.

The dampening candidates are dampened. (Block 344) This can include modifying the stored log likelihood ratio lookup tables to apply dampening, and generating dampened log likelihood ratios from the read data, using the modified log likelihood ratio lookup tables, or any other suitable method of generating dampened log likelihood ratios from the read data and the stored log likelihood ratio lookup tables. The dampened log likelihood ratios are decoded, (Block 346) A determination is made as to whether the decoding converged. (Block 350) If the decoding successfully converged, the decoded data is output. (Block 316) Otherwise, if none of the dampened log likelihood ratios converged, the soft retry has failed and another recovery process can be initiated or a read failure can be signaled. (Block 352)

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, embodiments of the present invention provide novel systems, devices, methods and arrangements for selective decoder likelihood dampening in a flash channel. While detailed descriptions of one or more embodiments of the invention, have been given above, various alternatives, modifications, and equivalents will be apparent to those skilled in the art without varying from the spirit of the invention. Therefore, the above description should not be taken as limiting the scope of embodiments of the invention which are encompassed by the appended claims.

What is claimed is:

1. A device comprising:
   a digital read channel circuit including:
      a circuit configured to map received data patterns to likelihood values;
      a decoder configured to decode the likelihood values;
      a control circuit configured to:
         select at least one dampening candidate from the likelihood values that failed decoding;
         dampen the at least one dampening candidate such that the likelihood value of the at least one dampening candidate is reduced to generate dampened likelihood values; and
      the decoder configured to decode the dampened likelihood values to output decoded data.

2. The device of claim 1 further comprising the digital read channel includes a memory configured to store the likelihood values.

3. The device of claim 1 further comprising the decoder includes a low density parity check decoder.

4. The device of claim 1 further comprising a retry circuit configured to perform additional recovery operations when a maximum number of retry read operations has been reached.

5. The device of claim 1 further comprising:
the decoder configured to determine syndrome weights and provide the syndrome weights to the control circuit; and
the control circuit configured to select the at least one dampening candidate based on the syndrome weights.

6. The device of claim 5 comprising the control circuit further configured to select the at least one dampening candidate when the at least one dampening candidate's syndrome weight is lower than a threshold.

7. The device of claim 5 comprising the control circuit further configured to select the at least one dampening candidate based on ranking failed likelihood values by their syndrome weights and selecting a pre-determined number of the failed likelihood values with lowest syndrome weights.

8. The device of claim 1 comprising the decoder further configured to:
determine if decoding the dampened likelihood values converged;
when the decoding converged, output the decoded data; and
when the decoding did not converge, initiate another recovery process.

9. The device of claim 1 comprising the decoder further configured to:
determine if decoding the dampened likelihood values converged;
when the decoding converged, output the decoded data; and
when the decoding did not converge, output a read failure indicator.

10. An apparatus comprising:
means for generating a plurality of likelihood value sets for a codeword read from a memory;
means for decoding the plurality of likelihood value sets and calculating a syndrome for each of the plurality of likelihood value sets that is decoded;
means for selecting at least one dampening candidate from among the likelihood value sets for which the decoding failed;
means for dampening at least a portion of the likelihood value set for the at least one dampening candidate such that the likelihood value of the at least one dampening candidate is reduced to yield at least one dampened likelihood value set; and
means for decoding the at least one dampened likelihood value set.

11. The apparatus of claim 10 wherein selecting at least one dampening candidate is performed after decoding of each of the plurality of likelihood value sets has failed.

12. The apparatus of claim 10 wherein generating the plurality of likelihood value sets for the codeword read from the flash memory includes performing a plurality of retry operations to facilitate decoding.

13. The apparatus of claim 10 further comprising a memory configured to store likelihood value lookup tables used to generate each of the plurality of likelihood value sets from the codeword.

14. The apparatus of claim 10 wherein the dampening includes modifying a stored log likelihood ratio lookup table to lower likelihood magnitudes for at least some codeword data before re-decoding.

15. The apparatus of claim 10 further comprising means for performing one or more read retry operations prior to performing dampening.

16. A digital data channel comprising:
a log likelihood ratio generation circuit configured to map received data to log likelihood ratios;
a decoder configured to:
decode the log likelihood ratios and output decoded data when a result vector is a zero-valued vector;
determine syndrome weights and provide the syndrome weights to a memory;
a control circuit configured to:
implement a dampening retry operation when the result vector is not a zero-valued vector, the dampening retry operation including dampening at least one log likelihood ratio that failed decoding such that the at least one dampened log likelihood ratio is reduced by the dampening;
select the at least one log likelihood ratio for dampening based on the syndrome weights; and
the decoder configured to retry decoding the at least one log likelihood ratio that failed decoding, the retry decoding based on the at least one dampened log likelihood ratio.

17. The digital data channel of claim 16 further comprising a retry circuit configured to perform additional recovery operations when a maximum number of retry decoding operations has been reached.

18. The digital data channel of claim 16 wherein the dampening at least one log likelihood ratio includes modifying a stored log likelihood ratio lookup table to lower likelihood magnitudes for at least some codeword data before re-decoding.

* * * * *